US009640596B2

(12) United States Patent
Hsieh et al.

(10) Patent No.: US 9,640,596 B2
(45) Date of Patent: May 2, 2017

(54) FLEXIBLE DISPLAY PANEL, MANUFACTURING METHOD THEREOF AND DISPLAY DEVICE

(71) Applicant: BOE TECHNOLOGY GROUP CO., LTD., Beijing (CN)

(72) Inventors: Ming Che Hsieh, Beijing (CN); Chunyan Xie, Beijing (CN); Lu Liu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 14/762,311

(22) PCT Filed: Nov. 12, 2014

(86) PCT No.: PCT/CN2014/090873
§ 371 (c)(1),
(2) Date: Jul. 21, 2015

(87) PCT Pub. No.: WO2016/015399
PCT Pub. Date: Feb. 4, 2016

(65) Prior Publication Data
US 2016/0254329 A1  Sep. 1, 2016

(30) Foreign Application Priority Data

Aug. 1, 2014  (CN) .......................... 2014 1 0377092

(51) Int. Cl.
*H01L 27/14* (2006.01)
*H01L 27/32* (2006.01)
*H01L 51/00* (2006.01)

(52) U.S. Cl.
CPC ...... *H01L 27/3244* (2013.01); *H01L 27/3276* (2013.01); *H01L 51/003* (2013.01);
(Continued)

(58) Field of Classification Search
CPC ............ H01L 27/3244; H01L 51/0097; H01L 2227/323; H01L 2924/1426; H01L 51/003;
(Continued)

(56) References Cited

U.S. PATENT DOCUMENTS 6,794,220 B2   9/2004  Hirai et al.
7,359,215 B2 * 4/2008  Ochiai ................. G09G 3/3233
                                                        174/254
(Continued)

FOREIGN PATENT DOCUMENTS

CN    103399423 A    11/2013
CN    103887315 A     6/2014
(Continued)

OTHER PUBLICATIONS

International Search Report of PCT/CN2014/090873 in Chinese, mailed Apr. 9, 2015 with English translation.
(Continued)

*Primary Examiner* — Yosef Gebreyesus
(74) *Attorney, Agent, or Firm* — Collard & Roe, P.C.

(57) ABSTRACT

A flexible display panel comprises a display element (100) and a drive unit (50) disposed on a first surface (A) of a flexible base (20) and a supporting substrate (200) disposed on a second surface (B), opposite to the first surface (A), of the flexible base (20). The position of the supporting substrate (200) corresponds to a bonding position (C) of the drive unit (50). The flexible display panel can avoid a bonding alignment deviation caused by a deformation of the flexible display panel during a bonding process.

15 Claims, 3 Drawing Sheets

(52) U.S. Cl.
CPC .... *H01L 51/0097* (2013.01); *H01L 2227/323* (2013.01); *H01L 2227/326* (2013.01); *H01L 2251/5338* (2013.01); *H01L 2924/1426* (2013.01); *Y02E 10/549* (2013.01)

(58) Field of Classification Search
CPC ......... H01L 27/3276; H01L 2251/5338; Y02E 10/549
See application file for complete search history.

(56) References Cited

U.S. PATENT DOCUMENTS

| | | | | |
|---|---|---|---|---|
| 8,319,725 | B2* | 11/2012 | Okamoto | G02F 1/133305 345/107 |
| 8,497,951 | B2* | 7/2013 | Kobayashi | G02F 1/133308 345/102 |
| 8,576,209 | B2 | 11/2013 | Miyaguchi | |
| 8,810,508 | B2 | 8/2014 | Okamoto et al. | |
| 2007/0082434 | A1* | 4/2007 | Bae | H01L 27/1214 438/149 |
| 2009/0135113 | A1* | 5/2009 | Taneda | G09G 3/3233 345/76 |
| 2010/0277448 | A1 | 11/2010 | Okamoto et al. | |
| 2011/0007042 | A1 | 1/2011 | Miyaguchi | |
| 2014/0042406 | A1* | 2/2014 | Degner | H01L 27/326 257/40 |
| 2014/0175463 | A1 | 6/2014 | Nam et al. | |

FOREIGN PATENT DOCUMENTS

| | | |
|---|---|---|
| CN | 203983288 U | 12/2014 |
| EP | 1291932 A2 | 3/2003 |
| WO | 2006/104118 A1 | 10/2006 |

OTHER PUBLICATIONS

Notice of Transmittal of the International Search Report of PCT/CN2014/090873 in Chinese, mailed Apr. 9, 2015.
Written Opinion of the International Searching Authority of PCT/CN2014/090873 in Chinese, mailed Apr. 9, 2015 with English translation.
Chinese Office Action in CN 201410377092.5 mailed Jul. 6, 2016.

* cited by examiner

FLEXIBLE DISPLAY PANEL, MANUFACTURING METHOD THEREOF AND DISPLAY DEVICE

CROSS REFERENCE TO RELATED APPLICATIONS

This application is the National Stage of PCT/CN2014/090873 filed on Nov. 12, 2014, which claims priority under 35 U.S.C. §119 of Chinese Application No. 201410377092.5 filed on Aug. 1, 2014, the disclosure of which is incorporated by reference.

TECHNICAL FIELD

At least one embodiment of the present invention relates to a flexible display panel, a manufacturing method thereof and a display device.

BACKGROUND

With the development of display technology, flexible display device, taken as flat panel display device, is more and more widely applied due to the advantages of low power consumption, deformability, and flexibility, etc. The flexible display devices may include organic light-emitting diode (OLED) display devices, electrophoretic display (EPD) devices, liquid crystal display (LCD) devices, etc.

SUMMARY

At least one embodiment of the present invention provides a flexible display panel, a manufacturing method thereof and a display device which are used for avoiding the bonding alignment deviation caused by the deformation of the flexible display panel during a bonding process.

In one aspect, the embodiment of the present invention provides a flexible display panel, which comprises: a display element and a drive unit disposed on a first surface of a flexible base, and a supporting substrate disposed on a second surface, opposite to the first surface, of the flexible base. The position of the supporting substrate corresponds to the bonding position of the drive unit.

In another aspect, the embodiment of the present invention provides a display device, which comprises the foregoing flexible display panel.

In still another aspect, the embodiment of the present invention provides a method for manufacturing a flexible display panel, which comprises: disposing a display element and a drive unit on a first surface of a flexible base; and disposing a supporting substrate on a second surface, opposite to the first surface, of the flexible base at a position corresponding to a bonding position of the drive unit.

BRIEF DESCRIPTION OF THE DRAWINGS

Simple description will be given below to the accompanying drawings of the embodiments to provide a clearer understanding of the technical proposals of the embodiments of the present invention. Obviously, the drawings described below only involve some embodiments of the present invention but are not intended to limit the present invention.

FIGS. 1a to 2c are schematic diagrams illustrating an manufacturing process of a flexible display panel;

FIG. 2 is a schematic structural view of a flexible display panel provided by an embodiment of the present invention;

REFERENCE NUMERALS OF THE ACCOMPANYING DRAWINGS

10—Support Substrate; 20—Flexible Base; 30—Array Structure; 40—Organic Material Functional Layer; 50—Drive Unit; 100—Display Element; 101—Pixel Electrode; 102—Cathode; 103—Thin-film Transistor (TFT); 1031—Drain Electrode; 200—Supporting Substrate; 300—First OC Layer; 301—Second OC Layer; 302—Barrier Layer; A—First Surface of Flexible Base; B—Second Surface of Flexible Base; C—Bonding Position of Drive Unit.

DETAILED DESCRIPTION

For clearer understanding of the objectives, technical solutions and advantages of the embodiments of the present invention, clear and complete description will be given below to the technical solutions of the embodiments of the present invention with reference to the accompanying drawings of the embodiments of the present invention. Obviously, the described embodiments are only part of embodiments of the present invention but not all the embodiments of the present invention. All the other embodiments obtained by those skilled in the art without creative efforts on the basis of the embodiments of the present invention illustrated shall fall within the scope of protection of the present invention.

Figure 1A:
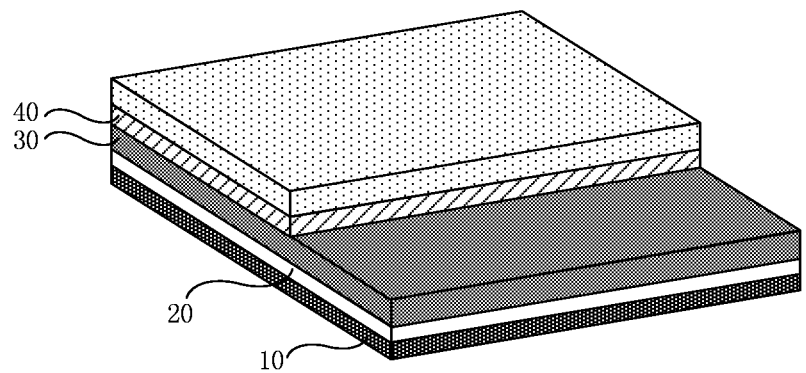
Figure 1B:
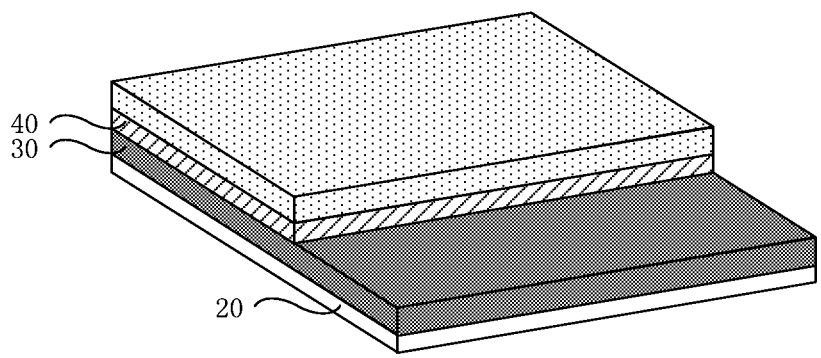
Figure 1C:
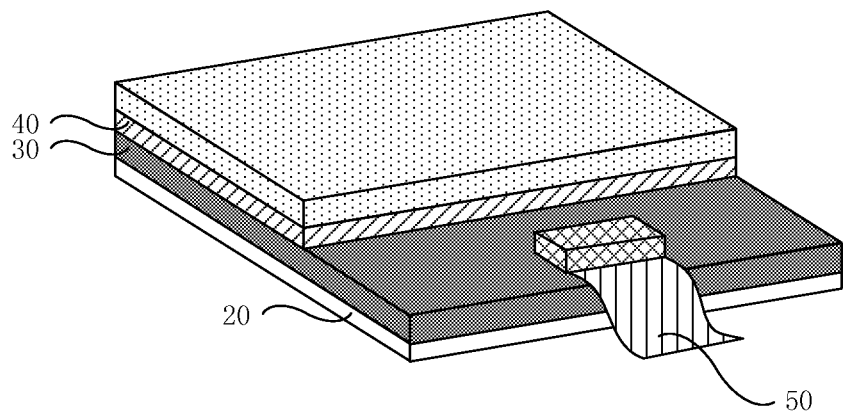

A method for manufacturing a flexible display device generally comprises: as illustrated in FIG. 1a, forming a flexible base 20 on a support substrate 10, in which the flexible base 20 is mainly made from organic materials such as polyimide, PET and the like; then, forming a structure for display, e.g., an array structure 30, including TFTs, gate lines, data lines and the like (not shown in the figure), and an organic material functional layer 40, including a hole layer, an electron layer, an organic emission layer (EML) and the like (not shown in the figure), on the flexible base 20 in sequence; after that, as illustrated in FIG. 1b, reducing the adhesion between the flexible base 20 and the support substrate 10 and separating the flexible base 20 from the support substrate 10 by a laser removing process and through an irradiation of an ultraviolet laser from the side of the support substrate 10, to form an independent flexible display panel; and finally, as illustrated in FIG. 1c, performing the bonding process of the drive unit 50 on the flexible display panel and bonding the drive unit 50 to the array substrate 30.

The inventor of the application found that: in the above described manufacturing process, when the support substrate 10 and the flexible base 20 are separated from each other, the flexible base 20 tends to be deformed due to the influence of the stress of materials of different thin-film layers on the surface of the flexible base 20. Moreover, a high temperature used in the bonding process will also result in the deformation of the flexible base 20. Thus, due to the deformation of the flexible base 20, the phenomenon of inaccurate bonding alignment can be caused, and hence the product quality can be affected.

Figure 2:
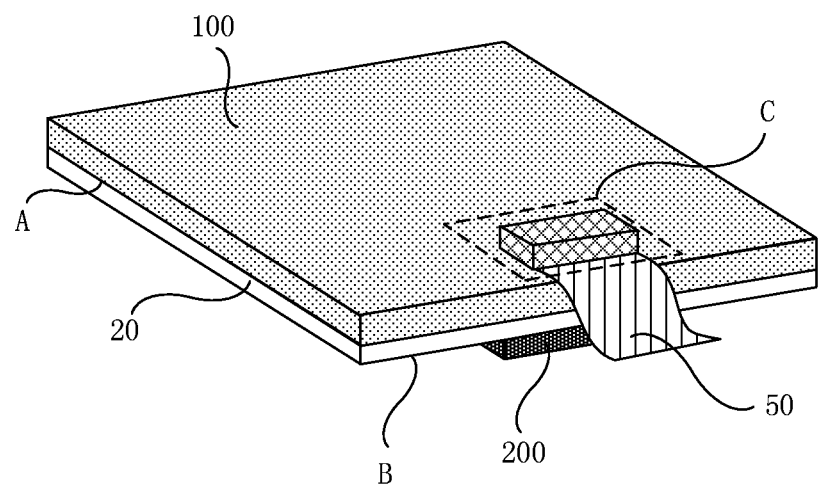

At least one embodiment of the present invention provides a flexible display panel. As illustrated in FIG. 2, the flexible display panel may comprise: a display element 100 and a drive unit 50 disposed on a first surface A of a flexible base 20, and a supporting substrate 200 disposed on a second surface B, opposite to the first surface A, of the flexible base 20. A position of the supporting substrate 200 corresponds to a bonding position C of the drive unit 50.

It should be noted that: firstly, in the embodiment of the present invention, the supporting substrate 200 may be a single-layer substrate and may also be a composite structure formed by at least two layers of substrates. When the drive unit 50 is bonded to the bonding position C of the drive unit of the flexible display panel, the drive unit 50 may be supported by the supporting substrate 200, and hence the phenomenon of inaccurate bonding alignment caused by the deformation of the flexible display panel can be avoided. Therefore, no matter the supporting substrate 200 is formed by one layer or a plurality of layers, the supporting substrate 200 should be a rigid substrate so as to have supporting function. There is no limitation on the material for forming the rigid substrate in the embodiments of the present invention.

Secondly, the display unit 100 may change according to the type of the flexible display panel.

Figure 3:
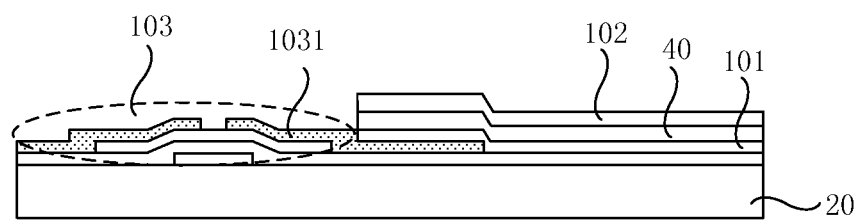
FIG. 3 is a schematic structural view of a display element in an embodiment of the present invention.

For instance, when the flexible display panel is an organic light-emitting diode (OLED) display panel, the display unit 100, as illustrated in FIG. 3, may at least include: pixel electrodes 101, an organic material functional layer 40 and a cathode 102 disposed on the first surface A of the flexible base 20 in sequence. As a material for preparing the organic material functional layer 40 may be sensitive to water, oxygen and the like, an encapsulation layer (not shown in the figure) for encapsulating the organic material functional layer 40 is also formed after the above display structures are formed.

For instance, the display unit 100 may further include TFTs 103 disposed between the first surface A of the flexible base 20 and the pixel electrodes 101. Drain electrodes 1031 of the TFTs are electrically connected with the pixel electrodes 101.

Description will be given to the embodiment of the present invention by taking the case that the flexible display panel is an OLED display panel as an example. But the embodiments of the present invention are not limited thereto.

Thirdly, the TFT 103 is a semiconductor unit with switching characteristic, for instance, may be, but not limit to, an amorphous silicon (a-Si) TFT, a low-temperature polysilicon TFT, an oxide TFT, an organic TFT, and the like.

The TFT 103 may adopt, but not limit to, top-gate type, bottom-gate type, and the like. Top gate and bottom gate are determined by the relative positions of gate electrodes and a gate insulating layer. That is to say, as for the flexible base 20, when the gate electrode of the TFT 103 is nearer to the flexible base 20 and the gate insulating layer is farther from the flexible base 20, the TFT is a bottom-gate TFT; and when the gate electrode is farther from the flexible base 20 and the gate insulating layer is nearer to the flexible base 20, the TFT is a top-gate TFT.

Fourthly, in the embodiments of the present invention, the bonding position C of the drive unit is set on the array structure 30 provided with the TFTs 103. Thus, the drive unit 50 at the bonding position C of the drive unit may input control signals to gate lines connected with the gate electrodes of the TFTs 103 and control the on and off states of the TFTs 103. In addition, the drive unit 50 may also input data signals to data lines connected with source electrodes of the TFTs 103 and control the display of the flexible display panel.

The drive unit 50 may include a gate electrode drive module and a data line drive module configured to input signals to gate lines and data lines respectively. Alternatively, the drive unit 50 may be an integrated drive module which not only can input signals to the gate lines but also can input signals to the data lines. For instance, when the drive unit 50 includes the gate electrode drive module and the data line drive module, two drive unit bonding positions C must be set on the flexible display panel to correspond to the gate electrode drive module and the data line drive module respectively. In this case, two supporting substrates 200 must be disposed on the second surface B of the flexible base 20 to respectively correspond to the drive unit bonding positions C of the gate electrode drive module and the data line drive module. Moreover, for instance, when the drive unit 50 is an integrated drive module, only one supporting substrate 200 must be disposed on the second surface B of the flexible base 20 to correspond to the integrated drive module. Of course, the foregoing only illustrates the setting number of the supporting substrates 200. The settings of other numbers need not to be illustrated here one by one and shall all fall within the scope of protection of the present invention.

The embodiment of the present invention provides a flexible display panel, which comprises a display element and a drive unit disposed on a first surface of a flexible base, and a supporting substrate disposed on a second surface, opposite to the first surface, of the flexible base. The position of the supporting substrate corresponds to the bonding position of the drive unit. Thus, during the drive unit bonding process, the drive unit can be supported by the supporting substrate, so that the phenomenon of inaccurate bonding alignment caused by the deformation of the flexible display panel can be avoided, and hence the product quality can be improved.

It should be noted that: during the process of manufacturing the flexible display panel, firstly, a flexible base 20 must be formed on a support substrate 10; secondly, structures for display, namely display elements 100, are formed on the flexible base 20 in sequence; thirdly, the laser removing process is adopted and an ultraviolet laser is adopted to irradiate the flexible base 20 from the side of the support substrate 10, so as to reduce the adhesion between the flexible base 20 and the support substrate 10 and separate the flexible base 20 from the support substrate 10 to form an independent flexible display panel; and finally, the bonding process of the drive unit is performed on the flexible display panel.

In the embodiment of the present invention, the supporting substrate 200 is disposed at the bonding position C of the drive unit to support the drive unit, so that the phenomenon of inaccurate bonding alignment caused by the deformation of the flexible display panel can be avoided. In order to improve the productivity, in one embodiment, the supporting substrate 200 is a glass substrate. That is to say, when the laser removing process is adopted, the support substrate 10 (may be formed by a glass substrate) not corresponding to the bonding position C of the drive unit is removed, and the support substrate 10 corresponding to the bonding position C of the drive unit is retained to form the supporting substrate 200. Therefore, a reduced productivity due to the addition of other manufacturing steps and processes when the supporting substrate 200 is formed by other means can be avoided.

Figure 4:
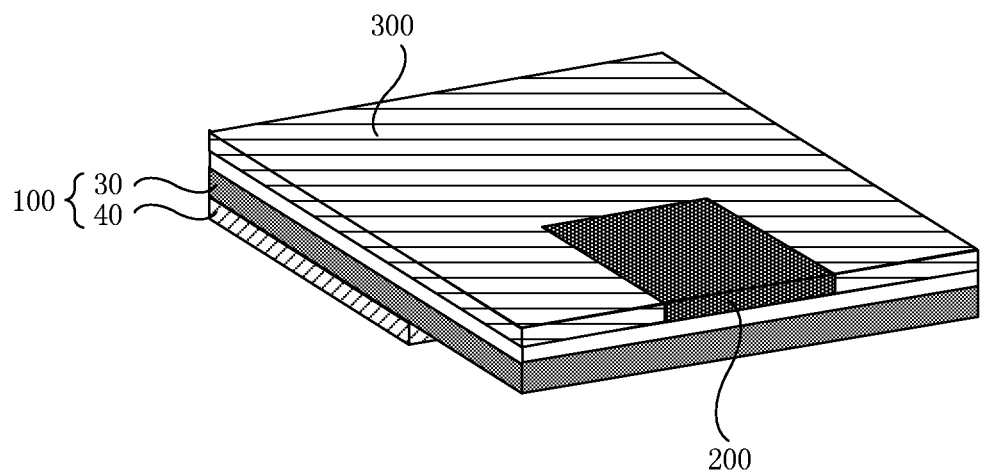
FIG. 4 is a schematic structural view of another flexible display panel provided by an embodiment of the present invention.

In at least one embodiment, as illustrated in FIG. 4, the flexible display panel may further comprise a first OC layer 300. The first OC layer 300 is arranged in the same layer with the supporting substrate 200 and configured to cover the second surface B of the flexible base 20 except an area occupied by the supporting substrate 200.

For instance, materials for preparing the first OC layer 300 may at least include any one selected from the group consisting of PET resin and PEN. The material is in a solid state at room temperature. Thus, the shape of the first OC layer 300 may be accurately processed according to the shape and the size of the supporting substrate 200. For instance, part of the first OC layer 300 may be removed, and the shape of the removed part is matched with the shape of the supporting substrate 200, so that the first OC layer 300 can be arranged in the same layer with the supporting substrate 200. In addition, the surface of the processed first OC layer 300 is flat and attached to the second surface B of the flexible base 20 at a high degree. Thus, gaps between the first OC layer 300 and the supporting substrate 200 can be reduced or eliminated as much as possible, and meanwhile, the manufacturing efficiency and the manufacturing accuracy can be improved. Moreover, the first OC layer 300 can protect the flexible display panel, reduce the sectional difference between the supporting substrate 200 and the flexible base 20, obtain a flat back side of the flexible display panel, and avoid the damage to the supporting substrate 200 during the transportation or use due to the sectional difference.

Alternatively, the first OC layer 300 may also be configured to cover the second surface B corresponding to a display area (an active area, referred to as AA area for short) of the flexible display panel.

As the material for preparing the first OC layer 300 is in a solid state at the room temperature, a first OC layer 300 having a shape and a size that are matched with those of the display area of the flexible display panel may be directly processed to cover the display area. Thus, the surface of the processed first OC layer 300 is flat and attached to the second surface B of the flexible base 20 at a high degree. The display area of the flexible display panel can be protected by the first OC layer 300, and the adverse effects on the flexible display panel caused by dust, oxygen or water vapor can be avoided.

Figure 5:
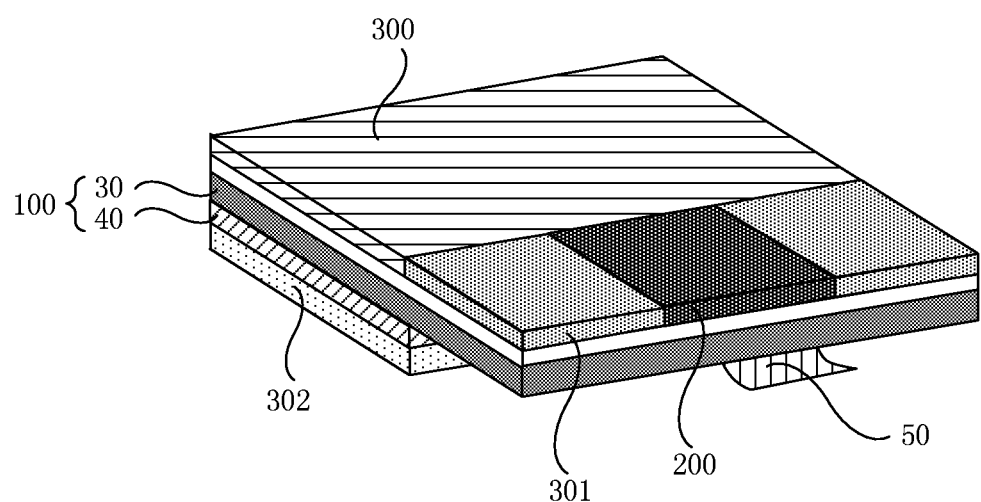
FIG. 5 is a schematic structural view of still another flexible display panel provided by an embodiment of the present invention.

In one embodiment, when the first OC layer 300 is configured to cover the second surface B corresponding to the display area of the flexible display panel, as illustrated in FIG. 5, the flexible display panel may further comprise: a second OC layer 301 which is arranged in the same layer with the supporting substrate 200 and configured to cover the second surface B of the flexible base 20 except an area occupied by the supporting substrate 200 and the first OC layer 300.

For instance, materials for preparing the second OC layer 301 may at least include at least one selected from the group consisting of epoxy resin and acrylic resin. As the material will be in a flowable state at room temperature within a period of time, after the first OC layer 300 is configured to cover the second surface B of the flexible base 20, the material may be coated on the second surface B of the flexible base 2 and cured for a period of time to form the second OC layer 301. As the material has flowability, gaps between the first OC layer 300, the supporting substrate 200 and the second OC layer 301 can be avoided and exposed areas on the second surface B of the flexible base 20 can be eliminated. Thus, the flexible display panel can be protected under the action of the first OC layer 300 and the second OC layer 301. In addition, the second OC layer 301 can also reduce the sectional difference between the supporting substrate 200 and the flexible base 20, so that a flat back side of the flexible display panel can be obtained, and hence the damage to the supporting substrate 200 during the transportation or use due to the presence of the sectional difference can be avoided.

In at least one embodiment, as illustrated in FIG. 5, the flexible display panel may further comprise a barrier layer 302 disposed on a surface of the display element 100. For instance, the barrier layer 302 may be formed by any one selected from the group consisting of UV curing adhesive, polymethyl methacrylate, polyimide, parylene, polyacrylate, and the like, and any combination thereof. The barrier layer 302 has the function of blocking water and oxygen, can prevent water vapor and oxygen from entering the display element 100, and hence can avoid the water vapor and the oxygen from contacting the surface of the display element 100.

At least one embodiment of the present invention provides a display device, which comprises any foregoing flexible display panel. As the structure of the flexible display panel has been described in detail in the above embodiments, no further description needs to be given here.

In the embodiment of the present invention, the display device, for instance, may include LCD device, OLED display device, EPD device, etc. For instance, the display device may be any product or component with display function such as an LCD, e-paper, an OLED panel, an LCD TV, a digital picture frame, a mobile phone and a tablet PC.

The embodiment of the present invention provides a display device, which comprises a flexible display panel. The flexible display panel comprises a display element and a drive unit disposed on a first surface of a flexible base, and a supporting substrate disposed on a second surface, opposite to the first surface, of the flexible base. The position of the supporting substrate corresponds to a bonding position of the drive unit. Thus, in the drive bonding process, the drive unit may be supported by the supporting substrate, so that the phenomenon of inaccurate bonding alignment caused by the deformation of the flexible display panel can be avoided, and hence the product quality can be improved.

At least one embodiment of the present invention provides a method for manufacturing a flexible display panel. As illustrated in FIG. 2, the method may comprise: disposing a display unit 100 and a drive unit 50 on a first surface of a flexible base 20; and disposing a supporting substrate 200 on a second surface B, opposite to the first surface A, of the flexible base 20 at a position corresponding to a bonding position C of the drive unit.

The embodiment of the present invention provides a method for manufacturing a flexible display panel, which comprises: disposing a display unit and a drive unit on a first surface of a flexible base; and disposing a supporting substrate on a second surface, opposite to the first surface, of the flexible base at a position corresponding to a bonding position of the drive unit. Thus, in the drive unit bonding process, the drive unit can be supported by the supporting substrate, so that the phenomenon of inaccurate bonding alignment caused by the deformation of the flexible display panel can be avoided, and hence the product quality can be improved.

In one embodiment, the method for manufacturing the flexible display panel may comprise the step of disposing the flexible base 20 on a support substrate 10. In this case, the step of disposing the supporting substrate 200 may include: lifting off the flexible base 20 from the support substrate by laser life-off process on a surface of the support substrate 10 disposed on the second surface A of the flexible base 20 in an area not corresponding to the bonding position C of the drive unit.

In this case, the supporting substrate 200 may be formed by the support substrate corresponding to the bonding position C of the drive unit. Therefore, a reduced productivity due to the addition of other manufacturing steps and processes when the supporting substrate 200 is formed by other means can be avoided.

For instance, the support substrate 10 may be a glass substrate.

It should be noted that: in the process of manufacturing the flexible display panel, firstly, a flexible base 20 must be formed on a support substrate 10; secondly, structures for display, namely display elements 100, are formed on the flexible base 20 in sequence; thirdly, the laser removing process is adopted and an ultraviolet laser is adopted to irradiate the flexible base 20 from the side of the support substrate 10, so as to reduce the adhesion between the flexible base 20 and the support substrate 10 and separate the flexible base 20 from the support substrate 10 to form an independent flexible display panel; and finally, the bonding process of the drive unit 50 is performed on the flexible display panel.

In at least one embodiment, before the step of disposing the drive unit 50, the method for manufacturing the flexible display panel may comprise: covering a first OC layer 300 on the second surface B of the flexible base 20 in an area not provided with the supporting substrate 200.

For instance, materials for preparing the first OC layer 300 may at least include any one selected from the group consisting of PET resin and PEN. The material is in a solid state at room temperature. Thus, the shape of the first OC layer 300 may be accurately processed according to the shape and the size of the supporting substrate 200. For instance, part of the first OC layer 300 may be removed, and the shape of the removed part is matched with the shape of the supporting substrate 200, so that the first OC layer 300 can be arranged in the same layer with the supporting substrate 200. In addition, the surface of the processed first OC layer 300 is flat and attached to the second surface B of the flexible base 20 at a high degree. Thus, gaps between the first OC layer 300 and the supporting substrate 200 can be reduced or eliminated as much as possible, and meanwhile, the manufacturing efficiency and the manufacturing accuracy can be improved. Moreover, the first OC layer 300 can protect the flexible display panel, reduce the sectional difference between the supporting substrate 200 and the flexible base 20, obtain a flat back side of the flexible display panel, and avoid the damage to the supporting substrate 200 during the transportation or use due to the sectional difference.

Alternatively, the first OC layer 300 is configured to cover the second surface B of the flexible base 20 in an area corresponding to an effective display area of the flexible display panel.

As the materials for preparing the first OC layer 300 are in a solid state at the room temperature, the first OC layer 300 of which the shape and the size are matched with those of the effective display area of the flexible display panel may be directly processed to cover the effective display area. Thus, the surface of the processed first OC layer 300 is flat and attached to the second surface B of the flexible base 20 at a high degree. The effective display area of the flexible display panel can be protected by the first OC layer 300, and the adverse effects on the flexible display panel caused by dust, oxygen or water vapor can be avoided.

In one embodiment, after the step of covering the first OC layer 300 on the second surface B of the flexible base 20 in the area corresponding to the display area of the flexible display panel and before the step of disposing the drive unit, the method for manufacturing the flexible display panel may comprise: covering a second OC layer 301 on the second surface B of the flexible base 20 in an area not provided with the supporting substrate 200 and the first OC layer 300.

For instance, materials for preparing the second OC layer 301 may at least include: any one selected from the group consisting of epoxy resin and acrylic resin. As the material will be in a flowable state at room temperature within a period of time, after the first OC layer 300 is configured to cover the second surface B of the flexible base 20, the materials may be coated on the second surface B of the flexible base 2 and cured for a period of time to form the second OC layer 301. As the material has liquidity, gaps between the first OC layer 300, the supporting substrate 200 and the second OC layer 301 can be avoided and exposed areas on the second surface B of the flexible base 20 can be eliminated. Thus, the flexible display panel can be protected under the action of the first OC layer 300 and the second OC layer 301. In addition, the second OC layer 301 can also reduce the sectional difference between the supporting substrate 200 and the flexible base 20, so that flat back of the flexible display panel can be obtained, and hence the damage to the supporting substrate 200 during the transportation or use due to the sectional difference can be avoided.

In at least one embodiment, after the step of disposing the display element 100 and before the step of performing laser life-off, the method for manufacturing the flexible display panel may further comprise: forming a barrier layer 302 on a surface of the display element 100. For instance, the barrier layer 302 may be formed by any one selected from the group consisting of UV curing adhesive, polymethyl methacrylate, polyimide, parylene, polyacrylate, and the like, and any combination thereof. The barrier layer 302 has the function of blocking water and oxygen, can prevent water vapor and oxygen from entering the display element 100, and hence can avoid the water vapor and the oxygen from contacting the surface of the display element 100.

The foregoing is only the preferred embodiments of the present invention and not intended to limit the scope of protection of the present invention. The scope of protection of the present invention should be defined by the appended claims.

The application claims priority to the Chinese patent application No. 201410377092.5, filed Aug. 1, 2014, the disclosure of which is incorporated herein by reference as part of the application.

What is claimed is:

1. A flexible display panel, comprising:
 a display element and a drive unit that are disposed on a first surface of a flexible base; and
 a supporting substrate disposed on a second surface, opposite to the first surface, of the flexible base, wherein
 a position of the supporting substrate corresponds to a bonding position of the drive unit, and the flexible display panel further comprises: a first overcoat (OC) layer, wherein
 the first OC layer is arranged in a same layer with the supporting substrate and configured to cover the second surface of the flexible base except an area occupied by the supporting substrate; or the first OC layer is configured to cover the second surface corresponding to a display area of the flexible display panel.

2. The flexible display panel according to claim 1, wherein the supporting substrate is a glass substrate.

3. The flexible display panel according to claim 1, wherein the first OC layer is configured to cover the second surface corresponding to the display area of the flexible display panel, and the flexible display panel further comprises:

a second OC layer arranged in a same layer with the supporting substrate and configured to cover the second surface of the flexible base except an area, which is occupied by the supporting substrate and the first OC layer.

4. The flexible display panel according to claim 3, wherein a material for forming the second OC layer at least includes any one selected from the group consisting of epoxy resin and acrylic resin.

5. The flexible display panel according to claim 4, wherein a material for forming the first OC layer at least includes any one selected from the group consisting of polyethylene terephthalate (PET) resin and polyethylene naphthalate (PEN).

6. The flexible display panel according to claim 3, wherein a material for forming the first OC layer at least includes any one selected from the group consisting of polyethylene terephthalate (PET) resin and polyethylene naphthalate (PEN).

7. The flexible display panel according to claim 1, wherein a material for forming the first OC layer at least includes any one selected from the group consisting of polyethylene terephthalate (PET) resin and polyethylene naphthalate (PEN).

8. A display device, comprising the flexible display panel according to claim 1.

9. A method for manufacturing a flexible display panel, comprising:

disposing a display element and a drive unit on a first surface of a flexible base; and disposing a supporting substrate on a second surface, opposite to the first surface, of the flexible base at a position corresponding to a bonding position of the drive unit, wherein the method further comprises, before the step of disposing the drive unit:

covering a first overcoat (OC) layer on the second surface of the flexible base in an area not occupied by the supporting substrate; or covering a first OC layer on the second surface of the flexible base in an area corresponding to a display area of the flexible display panel.

10. The method for manufacturing the flexible display panel according to claim 9, wherein the flexible base is provided on a support substrate;

on a surface of the support substrate disposed on the second surface of the flexible base except an area corresponding to the bonding position of the drive unit, the flexible base is removed from the support substrate by a laser removing process; and the supporting substrate is formed by a part of the support substrate corresponding to the bonding position of the drive unit.

11. The method for manufacturing the flexible display panel according to claim 10, wherein the supporting substrate is a glass substrate.

12. The method for manufacturing the flexible display panel according to claim 9, comprising, after the step of covering the first OC layer on the second surface of the flexible base in the area corresponding to the display area of the flexible display panel and before the step of disposing the drive unit:

covering a second OC layer on the second surface of the flexible base in an area not occupied by the supporting substrate and the first OC layer.

13. The method for manufacturing the flexible display panel according to claim 12, wherein a material for forming the second OC layer at least includes any one selected from the group consisting of epoxy resin and acrylic resin.

14. The method for manufacturing the flexible display panel according to claim 12, wherein a material for forming the first OC layer at least includes any one selected from the group consisting of PET resin and PEN.

15. The method for manufacturing the flexible display panel according to claim 9, wherein a material for forming the first OC layer at least includes any one selected from the group consisting of PET resin and PEN.

* * * * *